United States Patent [19]

Tagaya

[11] Patent Number: 5,325,332
[45] Date of Patent: Jun. 28, 1994

[54] DUAL PORT SEMICONDUCTOR MEMORY DEVICE

[75] Inventor: Mitsue Tagaya, Kawasaki, Japan

[73] Assignee: Nec Corporation, Tokyo, Japan

[21] Appl. No.: 956,244

[22] Filed: Oct. 5, 1992

[30] Foreign Application Priority Data

Oct. 3, 1991 [JP] Japan .................. 4-256113

[51] Int. Cl.$^5$ .............................................. G11C 8/00
[52] U.S. Cl. .................. 365/200; 365/230.05; 365/230.06
[58] Field of Search .............. 365/200, 230.05, 230.06

[56] References Cited

U.S. PATENT DOCUMENTS

| | | | |
|---|---|---|---|
| 4,633,441 | 12/1986 | Ishimoto | 365/189 |
| 4,870,621 | 9/1989 | Nakada | 365/230.05 |
| 4,989,181 | 1/1991 | Harada | 365/200 |
| 5,115,413 | 5/1992 | Sato et al. | 365/189.04 |

*Primary Examiner*—Eugene R. LaRoche
*Assistant Examiner*—F. Niranjan
*Attorney, Agent, or Firm*—Sughrue, Mion, Zinn, Macpeak & Seas

[57] ABSTRACT

A dual-port RAM according to the present invention includes means responsive to a first control signal for determining at an input of a counter whether or not a redundancy substitution is required during a time period for which a serial read out is performed, outputting a result of the determination as a second control signal and holding the second control signal. Therefore, the determination of necessity of redundancy substitution can be performed at a timing prior to the conventional serial read by one serial read cycle. Further, since there are a plurality of read data buses provided, an interleave read out becomes possible. Therefore, a time from the determination of necessity of substitution to the redundancy circuit to an execution of substitution is also shortened by one serial read cycle, resulting in a speed up of the serial read.

2 Claims, 12 Drawing Sheets

DUAL PORT SEMICONDUCTOR MEMORY DEVICE

BACKGROUND OF THE INVENTION

1. Field of the Invention

The present invention relates to a semiconductor memory device and, particularly, to a high speed serial accessible dual port semiconductor memory device.

2. Description of the Prior Art

In a compact computer such as a personal computer, a dual port memory for image processing, which is to be arranged between a CPU and a data display device to write/read display data under control of the CPU is commercially available and used widely. Such dual port memory has a random access port and a serial access port such as disclosed in U.S. Pat. No. 4,633,441 issued to S. Ishimoto on Dec. 30, 1986 and assigned to NEC corporation. The serial access port of the conventional dual port memory includes a memory cell array composed of a number of memory cells arranged at respective intersections of a plurality of rows and a plurality of columns, means for selecting one of the rows in response to a row address signal, means for transferring memory information of respective memory cells connected to the selected row in synchronism with transfer control signal and a data register for temporarily storing thus transferred information. Further, in order to serially read the temporarily stored data in the data register, the serial access port includes a serial data output buffer, a serial data output terminal, data shift means for sequentially shifting data up in synchronism with a first control signal, switch means responsive to an output of the data shift means for selecting one of data read out from the data register, a read bus line for connecting, through the switch means, the output of the data register to the serial data output buffer, means for decoding a row address signal for selecting one of the plurality of rows and initial value setting means for setting an initial value of the data shift means to an output of the decode means in synchronism with the transfer control signal and operates to output the output of the data register from the serial data output buffer.

On the other hand, with the recent development of semiconductor manufacturing technique, miniaturization of circuit elements on a semiconductor chip is enhanced, so that an area of the semiconductor chip required for one bit of memory cell is reduced, resulting in an increase of memory capacity from 256 K bits several years ago through 1 M bits to recent 4 M bits.

However, as disclosed in U.S. Pat. No. 4,989,181 issued to M. Harada on Jan. 29, 1991 and assigned to NEC corporation, miniaturization of circuit elements may cause the number of defects per semiconductor chip to be increased, so that the yield of such semiconductor memory device may be lowered. In order to avoid such degradation of yield, Harada employs the redundancy circuit technology.

A redundancy circuit of a serial access port of a conventional dual-port memory described in Harada includes a counter circuit having an externally supplied address signal code word as an initial value and incrementing from it in response to a first control signal, a defective address memory circuit for storing an address of a memory cell, a bit line and/or a serial register at which a defect is contained and a coincidence detection circuit for comparing an output of the counter circuit with an output of the defective address memory circuit. The redundancy circuit operates in response to a second control signal produced by the coincidence detection circuit upon detection of a coincidence of the outputs of the counter circuit and the defective address memory circuit to substitute a redundancy memory cell, a redundancy bit line and a redundancy serial register of the redundancy circuit for the defective memory cell, the defective bit line and/or the defective serial register, respectively.

The conventional dual-port semiconductor memory including such redundancy circuit as mentioned above sets the address signal code word in the counter circuit as well as a shift register included in the dual-port memory as their initial values in a serial read mode. Then, the shift register is incremented from the initial value by the first control signal as clock signal synchronized with an external clock. At the same time, the counter circuit is incremented by the first control signal and the output of the counter circuit is compared with the output of the defective address memory circuit.

The second control signal becomes active when the comparison indicates a coincidence upon which the redundancy circuit substitutes the memory cell, the bit line and/or the data register, which contains defect, by the memory cell, the bit line and/or the data register of the redundancy circuit having a corresponding address and reads a value stored in the data register of the redundancy circuit to an output portion of the serial port of the dual port memory. On the other hand, when the comparison indicates non-coincidence, the second control signal becomes inactive and the output value of the data register which has been transferred from the main memory cell in response to the output of the shift register and stored therein is read out to the output portion of the serial port. With the operations mentioned above, a cycle of serial read operation is completed and the first control signal is shifted to a next read out cycle. By repeating this operation cycle, the output of the data register is read out sequentially to the output portion of the serial port in response to the output of the shift register.

In the dual-port memory having such conventional redundancy circuit, however, time required to read from the serial port (referred to as "serial read time") is a sum of a shift operation time for shifting the output value of the data register to the serial port in response to the shift operation of the shift register due to the first control signal and a count-up coincidence detection time from a start time of count-up operation of the counter circuit by the first control signal to a time of coincidence detection between the outputs of the counter circuit and the defective address memory circuit. It is well known that the shift operation time is shorter than the count-up coincidence detection time. That is, the serial read time of the dual-port memory having the redundancy circuit is larger, so that an image processing speed of the dual-port semiconductor memory device becomes low.

In the serial read operation of the conventional dual-port memory mentioned above, the counter circuit counts up the first control signal one by one and the content of the counter circuit is compared with the value of the address which contains defect. Therefore, the comparison is performed for addresses subsequent to the initial value corresponding to the address code word. This means that, when there is any defect at the address corresponding to the initial value, it can not be substituted by a corresponding address of the redundancy circuit. In order to avoid this problem, it is necessary to access the address on the chip corresponding to the initial value by driving the counter circuit with another control signal and, therefore, the serial read control becomes complicated correspondingly.

SUMMARY OF THE INVENTION

Therefore, an object of the present invention is to provide a dual-port memory having a redundancy circuit the existence of which does not affect the serial read time adversely.

Another object of the present invention is to provide a dual-port memory which does not affect serial read of addresses subsequent to an address having an initial value assigned by an external address signal even when there is a defect in the address on the chip corresponding to the initial address value.

The dual-port memory in accordance with the present invention comprises a memory cell array including a plurality of memory cells arranged in row and column directions, a plurality of bit lines each connecting these memory cells in a row commonly and a plurality of word lines each connecting the memory cells in a column commonly, a row address decoder responsive to a row address signal to select one of the bit lines, a column address decoder responsive to a column address signal to select one of the word lines, at least one redundancy memory cell, a serial selector circuit for selecting the memory cells serially in synchronism with a first control signal, a defective address memory circuit for storing a location of a defective memory cell among the memory cells on a memory chip, a counter adapted to be incremented in response to the first control signal when an output of the defective address memory circuit coincides with an address of the memory cell selected by the serial selector circuit, a coincidence detection circuit including means for producing a second control signal for substituting the redundancy memory cell for the selected memory cell when an input signal of the counter coincides with an output of the defective address memory circuit and means for holding the second control signal, and means for receiving an initial address corresponding to an address signal code word.

The serial selector circuit may comprises a data register having a plurality of memory portions, a data transfer circuit for connecting the memory cells to the data register, a plurality of read data buses, a column selector circuit for connecting the data register to the read buses and a shift register having a plurality of outputs used to control the column selector circuit and preset with the initial address. The output holding means of the coincidence detection circuit may be constituted with a D-F/F circuit. The read data buses may be combined with a read data bus selector circuit operable in response to an output of the counter.

In another preferred embodiment of the present invention, the dual-port memory comprises a memory cell array including a plurality of memory cells arranged in row and column directions, a plurality of bit lines each connecting the memory cells in a row commonly and a plurality of word lines each connecting the memory cells in a column commonly, a column address decoder responsive to a column address signal to select one of the bit lines, a row address decoder responsive to a row address signal to select one of the word lines, at least one redundancy memory cell, a serial selector circuit for selecting the memory cells serially in synchronism with a first control signal, a defective address memory circuit for storing a location of a defective memory cell among the memory cells on a memory chip and a coincidence detection circuit including means for presetting an initial address corresponding to an address signal code word supplied externally, comparing it with an output of the defective address memory circuit and producing a second control signal for substituting the redundancy memory cell for the defective memory cell when the initial address coincides with the output of the defective address memory circuit and means for holding the second control signal.

According to the present invention which includes the means for determining at the input of the counter whether or not the substitution is to be performed by the redundancy circuit during a time period in which serial read is performed in response to the first control signal and outputting the determination as the second control signal, the determination of necessity of substitution to a corresponding redundancy circuit is performed at one read cycle in advance compared with the conventional serial read. Further, since there are the plurality of the read data buses, an interleave type read out becomes possible. Therefore, a time from the determination of necessity of substitution to the redundancy circuit to an execution of substitution is also shortened by one serial read cycle, resulting in a speed-up of the serial read.

According to a further embodiment of the present invention, it is possible to determine the necessity of substitution to the redundancy circuit prior to a count operation for the first control signal since, when there is a defect in the initial address which is preset in synchronism with the transfer control signal, the initial address can be compared with the output of the defective address memory circuit.

BRIEF DESCRIPTION OF THE DRAWINGS

The above-mentioned and other objects, features and advantages of the present invention will become more apparent by reference to the following detailed description of the present invention taken in conjunction with the accompanying drawings, wherein.

DETAILED DESCRIPTION OF THE INVENTION

Figure 1:
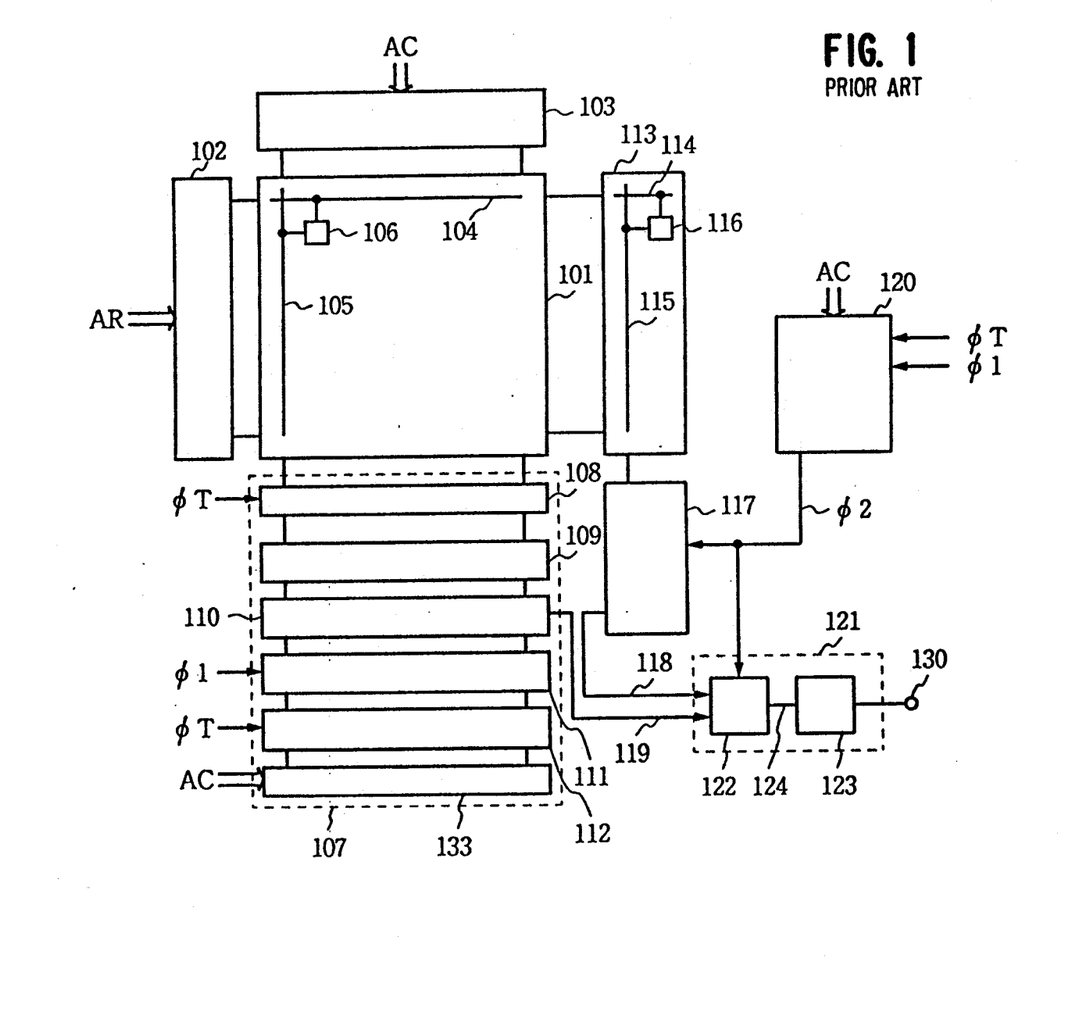
FIG. 1 is a block diagram showing a conventional dual-port RAM.

Referring to FIG. 1 which shows a conventional dual-port memory, the dual-port RAM comprises a memory cell array 101 composed of a matrix of a plurality of memory cells 106, a row address decoder 102 responsive to a row address signal AR for selecting one of a plurality of word lines 104 (shown by a single line in FIG. 1) arranged in a row direction of the memory cell array 101, a column address decoder 103 responsive to a column address signal AC for selecting one of a plurality of bit line pairs 105 (shown by a single line in FIG. 1), a serial selector circuit 107, a redundancy memory cell array 113 including plurality of redundancy memory cells 116, a redundancy serial selector circuit 117, a redundancy control circuit 120 and a serial data output portion 121.

The serial selector circuit 107 includes a data transfer circuit 108 for transferring information stored in the respective memory cells 106 connected to selected one of the word lines 104 in synchronism with a transfer control signal $\Phi T$, a data register 109 of N bits for temporarily storing a data transferred from the bit line pair 105 through the data transfer circuit 108 according to a clock operation of the transfer control signal $\Phi T$ (where N is an integer), an N-bit shift register 111 for producing an output for selective transfer of a memory content of the data register 109 on a read bus line 119 to the serial output portion 121 having a serial output terminal 130, a column selector switch circuit 110 responsive to an output of the shift register 111 for selecting one bit of the data register 109 and an address preset circuit 112 responsive to the transfer control signal $\Phi T$ for decoding the column address signal AC for selecting one of the columns by means of the decoder 103 and setting the decoded signal as an initial value of the N-bit shift register 111.

Figure 2:
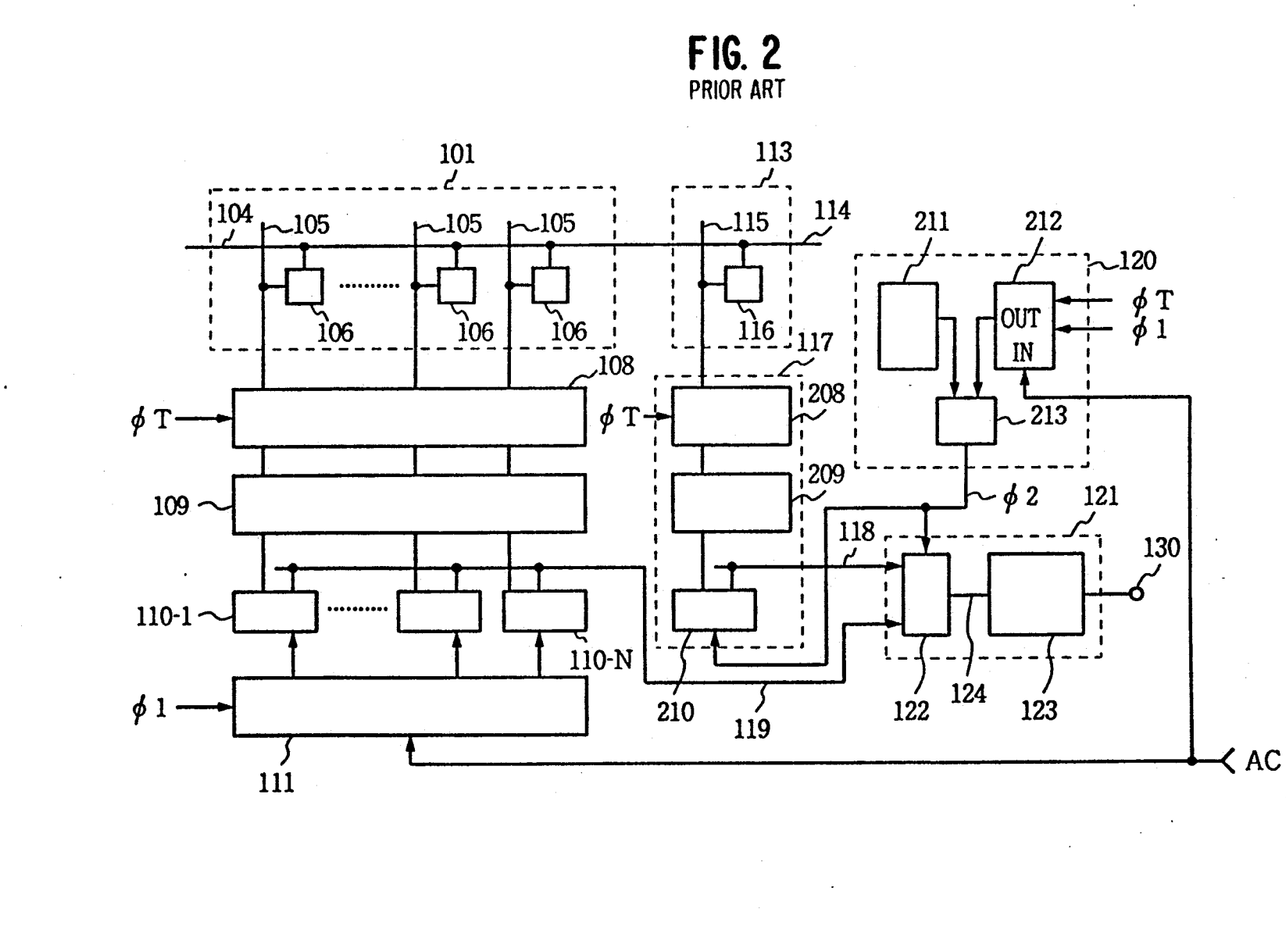
FIG. 2 is a block diagram of a portion of the RAM shown in FIG. 1 associated with a serial access port thereof.

In FIG. 2 which shows a portion of the dual-port memory in FIG. 1 in more detail, the redundancy memory cell array 113 includes a plurality of redundancy word lines 114 arranged in the row direction of the memory cell array 101, a plurality of redundancy bit line pairs 115 (only one line is shown in FIG. 2) arranged in the column direction of the memory cell array 101 and a plurality of redundancy memory cells 116 connected to the redundancy word lines 114 and the redundancy bit line pairs 115. The redundancy memory cell 116 is identical to the memory cell 106. The redundancy serial selector circuit 117 includes a redundancy transfer circuit 208 for transferring data of the memory cell 116 in synchronism with the transfer control signal $\Phi T$, a K-bit redundancy data register 209 for temporarily storing data of the cell 116 transferred from the redundancy bit line pair 115 through the redundancy transfer circuit 208 in synchronisim with the transfer control signal $\Phi T$ (where K is an integer smaller than N), a redundancy column selector switch circuit 210 responsive to an output of the redundancy data register 209 for selecting one bit of the register 209 and a redundancy read bus line 118 for selectively connecting data stored in the register 209 to the serial output portion 121. The redundancy control circuit 120 includes a defective address memory circuit 211 for storing an address in which a defect is contained, a counter 212 having an address assigned by the shift register 111 and adapted to be incremented by a first control signal $\Phi 1$ and a coincidence detection circuit 213 for producing a second control signal $\Phi 2$ when a defective location indicated by the output of the defective address memory circuit 211 coincides with the output of the counter 212. The serial output portion 121 includes a switch circuit 122 which is responsive to an inactive state of the second control signal $\Phi 2$ for connecting the read data bus 119 to an output data line 124 to output 1 bit of the data register 109 to the serial output terminal 130 through an output buffer 123 and responsive to an active state of the signal $\Phi 2$ for connecting the redundancy data bus 118 to the output data line 124 and outputting 1 bit of the redundancy data register 209.

As will be clear from the circuit construction mentioned above, the conventional dual-port RAM responds to the transfer control signal $\Phi T$ to set initial values of the shift register 111 and the counter 212 to the external address signal AC and, then, supplies the first control signal $\Phi 1$ synchronized with the external clock to the shift register 111 as a clock signal. As a result, data stored in the shift register 111 is shifted up from the initial value by the clock signal while the counter 212 is incremented by the first control signal $\Phi 1$. The incremented output of this counter 212 is compared with the output of the defective address memory circuit 211 and, when they are coincident with each other, the coincidence detection circuit 213 activates the second control signal $\Phi 2$. That is, the memory cell, the bit line or the data register which has a defect is substituted by the corresponding memory cell 116, the bit line 115 or the data register 209 of the redundancy circuit and data stored in the data register 209 is read out to the serial output portion 121. On the other hand, when the outputs of the counter 212 and the defective address memory circuit 211 differ from each other, the second control signal $\Phi 2$ becomes inactive upon which one of the column selector switch circuits (110-1 to 110-N) is turned on in response to an output of the shift register 111 to read data stored in the data register 109 to the serial output portion 121.

Figure 3:
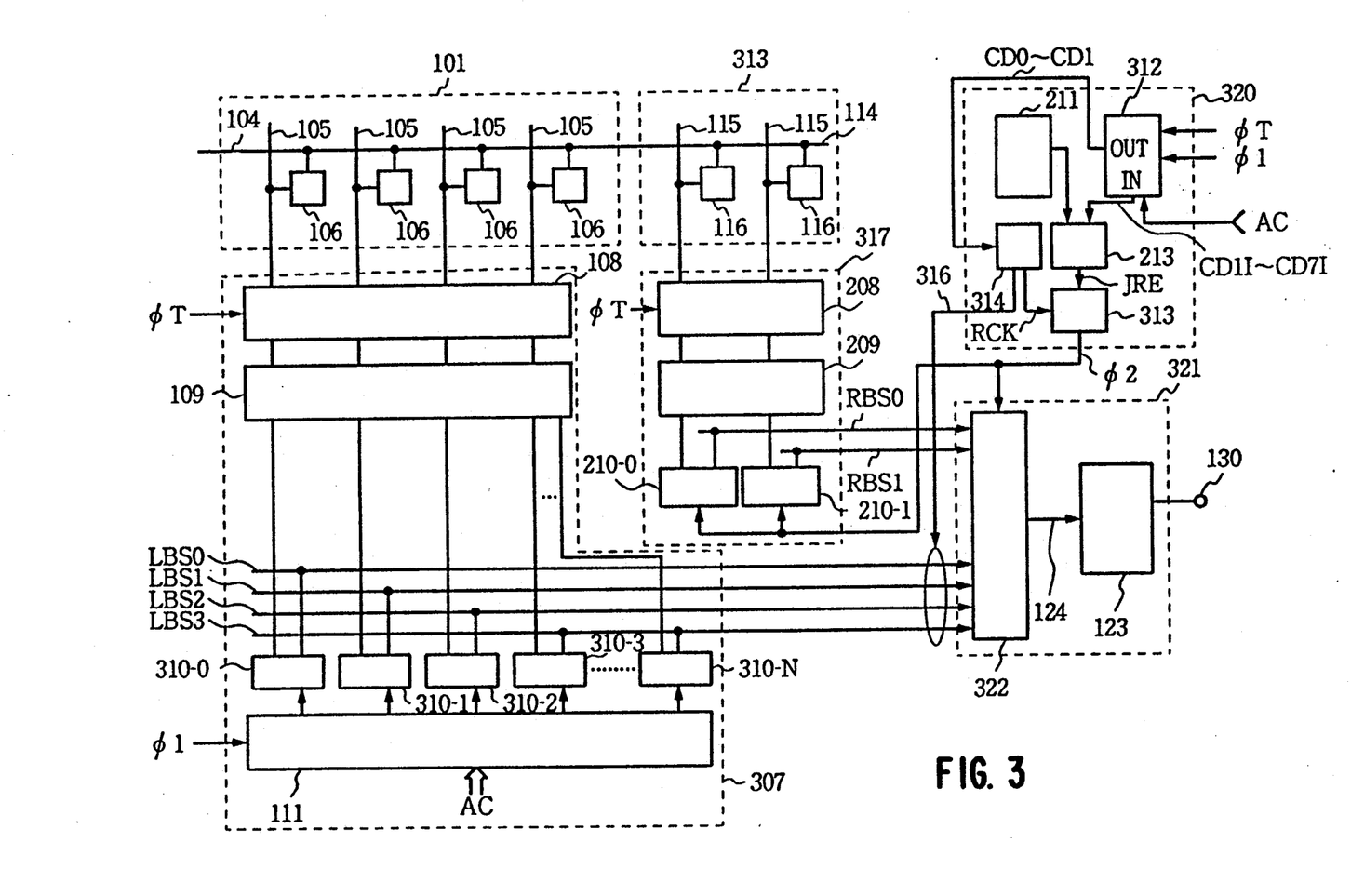
FIG. 3 is a block diagram showing a first embodiment of the present invention.

FIG. 3 shows a first embodiment of the present invention in which same blocks as those shown in FIG. 2 are depicted by same reference numerals, respectively. A redundancy memory cell array 313 of the dual-port RAM according to the first embodiment includes bit line pairs 115 corresponding to addresses of 2 columns in row direction and a redundancy serial selector circuit 317 includes redundancy column selector switch circuits 210-0 and 210-1 and redundancy read bus lines RS0 and RB1.

A redundancy control circuit 320 of the dual-port RAM of this embodiment includes a counter 312 for setting its initial value by a column address signal AC synchronized with a transfer control signal $\Phi T$ and being incremented by a first control signal $\Phi 1$, a D type flip-flop (DFF) 313 for holding an output of a coincidence detection circuit 213 for producing a second control signal upon coincidence of a defective location represented by a content of a defective address memory circuit 211 and an input of the counter 312 and a read data bus select signal generator circuit 314 for generating an output signal RCK to be supplied to the DFF 313 as a clock signal. It further includes column selector switch circuits 310-0 to 310-3 for selecting data of a data register 109 under control of an output of an N-bit shift register 111 and four read data bus lines LBS-0 to LBS-3 connected to the column selector switch circuits 310-0 to 310-3. A serial output portion 321 includes a selector circuit 322 which responds to the second control signal to switch the read data bus lines LBS-0 to LBS-3 to redundancy data bus lines RBS0 and RBS1 and responds to the output 316 of the read data bus select generator circuit 314 to selectively connect one of the read data bus lines LBS0 to LBS3 to the serial output terminal 130 through the output buffer 123. Other portions of the first embodiment of the present invention than those mentioned above are identical to those of the conventional dual-port RAM shown in FIG. 2.

Figure 11:
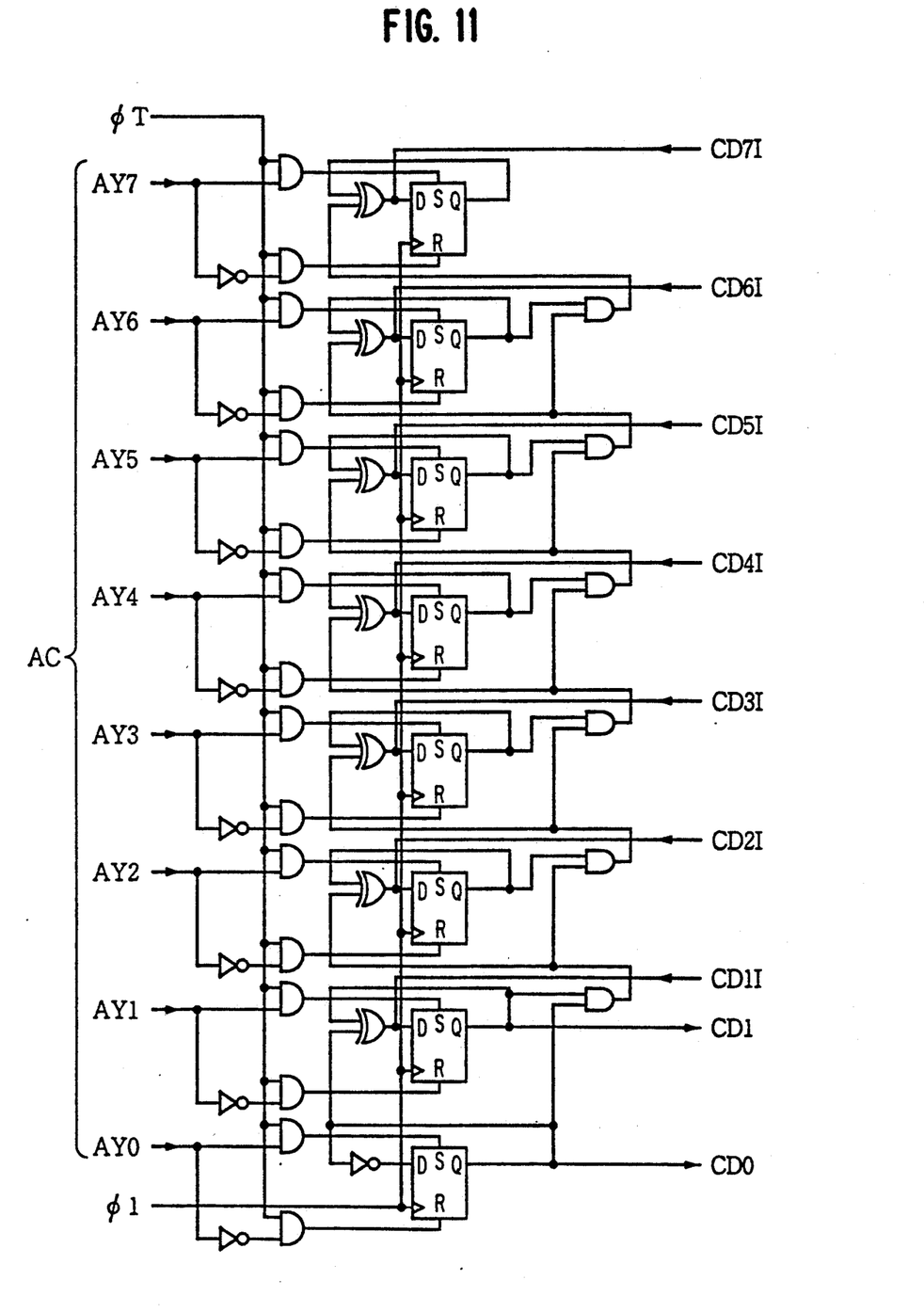
FIG. 11 is a circuit diagram of another portion of any of the first, second and third embodiments.

Referring to FIG. 11 which shows a circuit construction of the counter 312 of the first embodiment, the initial value of the counter 312 is set by an external address code word of parallel 8 bits AY0 to AY7 with using the transfer control signal ΦT as a clock. When the initial value setting is completes, parallel 8-bit input CD1I to CD7I of the counter 312 becomes the initial value plus 1. An output CD0 and CD1 of the counter 312 is counted as the least significant two bits. In response to an activation of the first control signal Φ1, the counter 312 is incremented.

Figure 6:
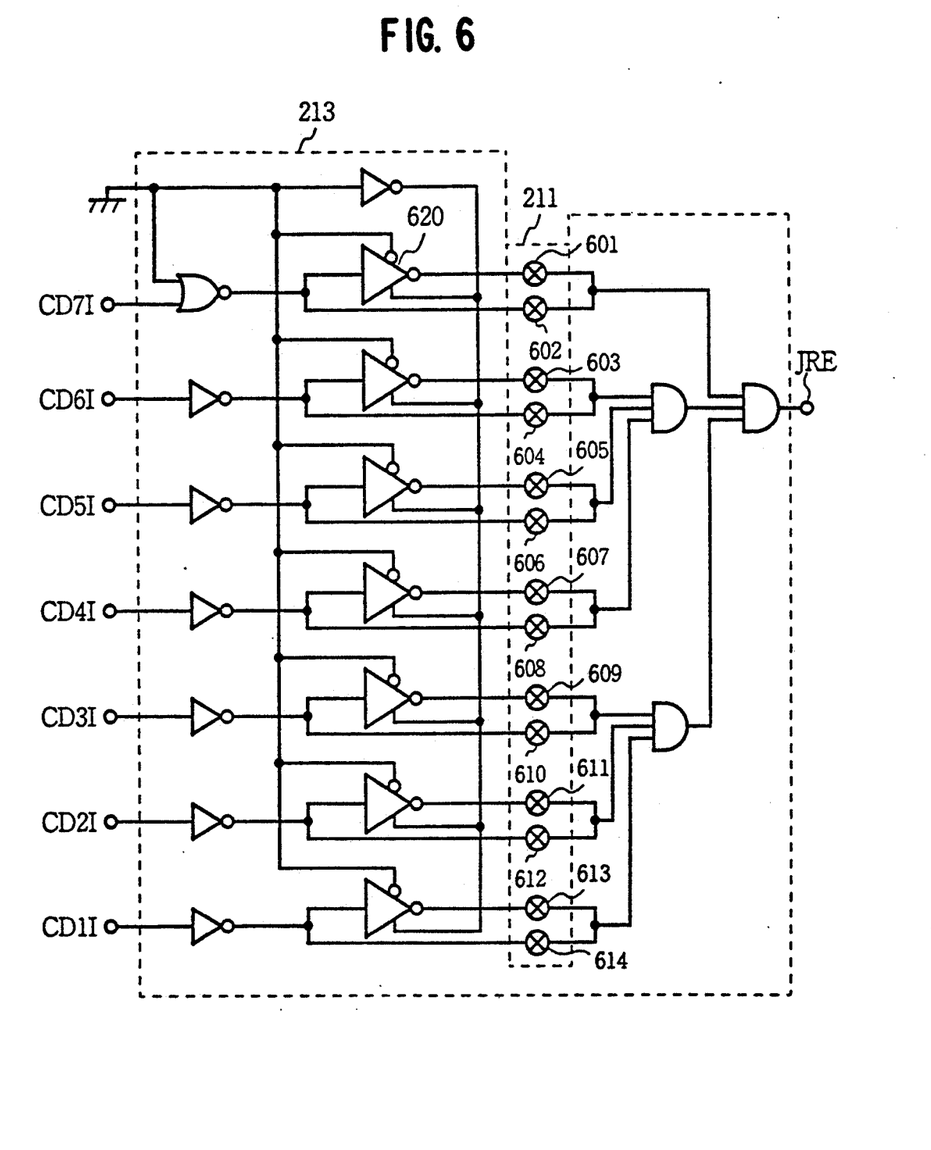
FIG. 6 is a circuit diagram showing a portion of the first embodiment.

Referring to FIG. 6 which shows a circuit construction of the defective address memory circuit 211 and the coincidence detection circuit 213, the defective address memory circuit 211 includes a plurality of fuse circuits 601 to 614 and indicates any defect by opening of one of the fuse circuits corresponding to an address of defective cell on the chip. On the other hand, the coincidence detection circuit 213 is supplied with the input signal CD1I to CD7I which are compared with binary number represented by the fuse circuits 601 to 614 through a clocked inverter 620 and activates an output JRE when the both coincide.

Figure 7:
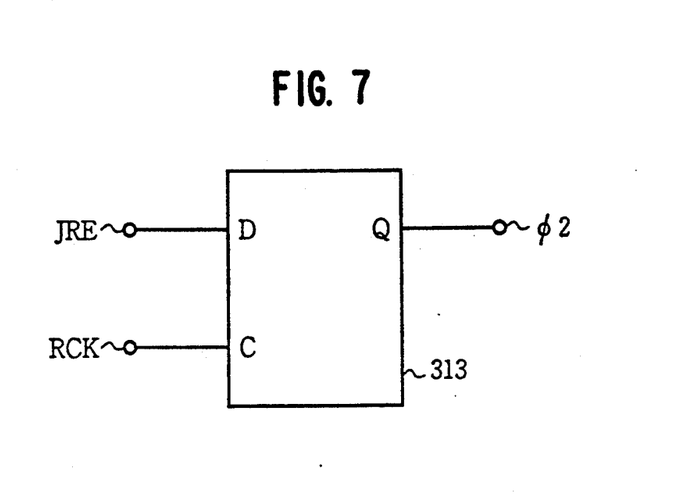
FIG. 7 is a circuit diagram showing another portion of the first embodiment.
Figure 8:
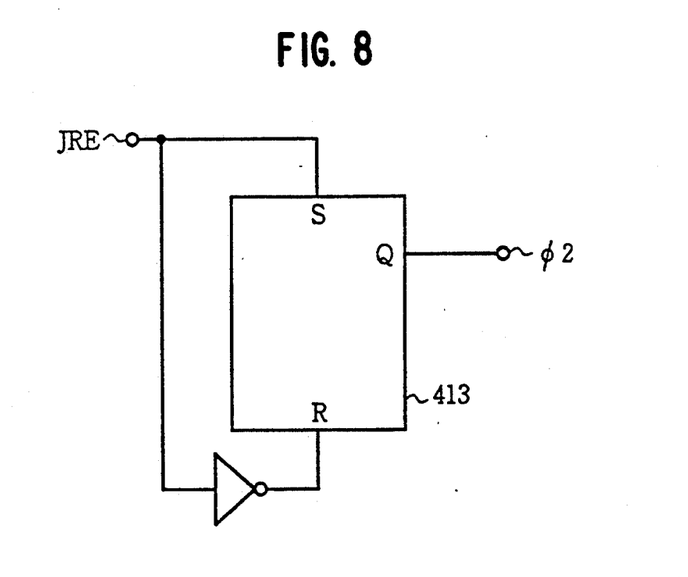
FIG. 8 is a circuit diagram showing a portion of the second embodiment.
Figure 9:
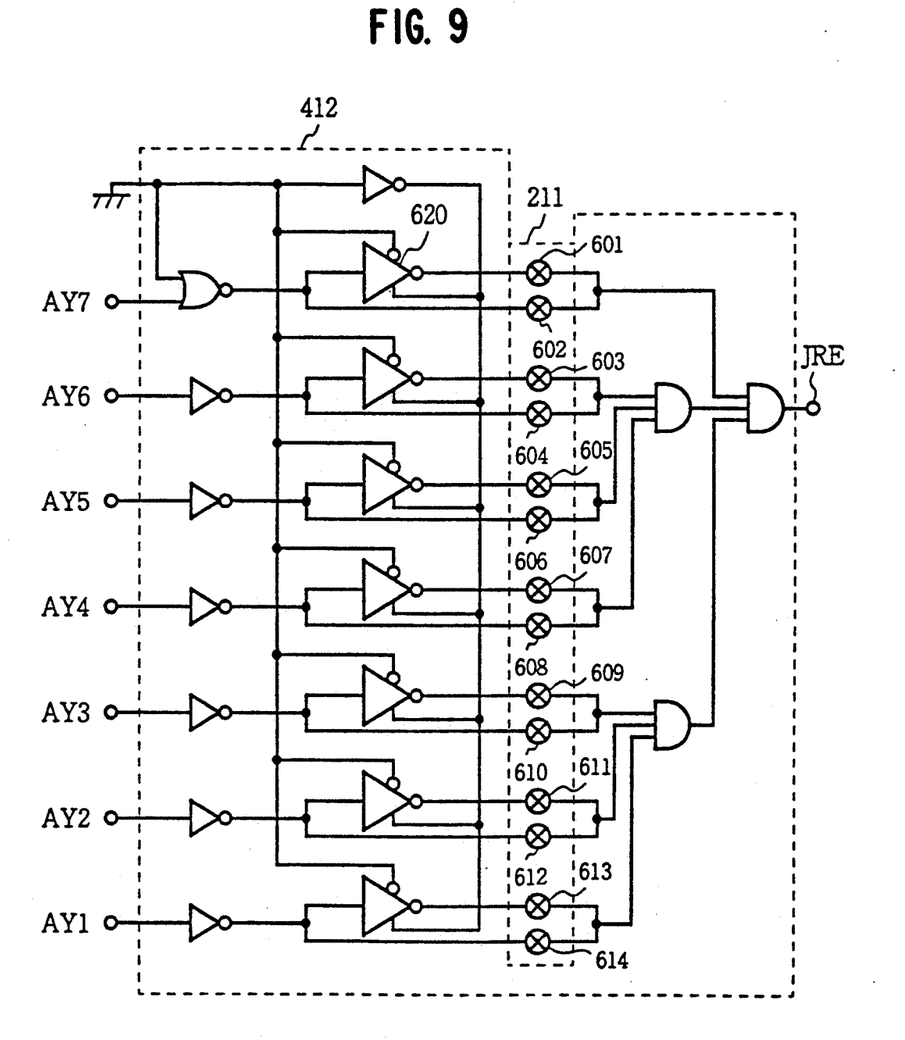
FIG. 9 is a circuit diagram showing another portion of the second embodiment.

The DFF 313 which is supplied at its D input with the output JRE of the coincidence detection circuit 213 includes an inter-terminal connection as shown in FIGS. 7 and 8.

Figure 10:
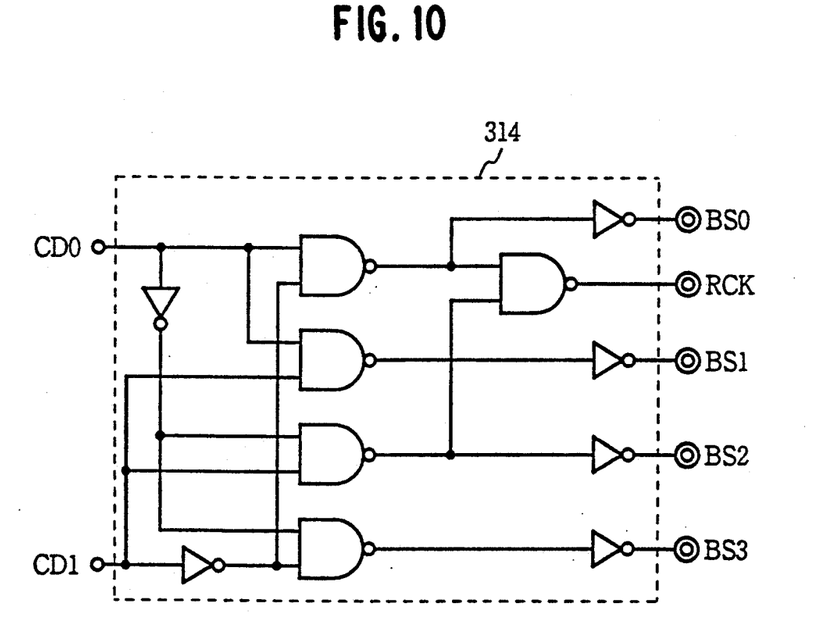
FIG. 10 is a circuit diagram of a portion of any of the first, second and third embodiments.

Referring to FIG. 10 which shows a circuit diagram of the read data bus select generator circuit 314 supplied with the output signals CD0 and CD1 of the counter 312, the read data bus select generator circuit 314 generates from the signals CD0 and CD1 output signals BS0 to BS3 corresponding to the read data buses LBS0 to LBS3 and a clock signal RCK for driving the DFF 313.

Figure 12:
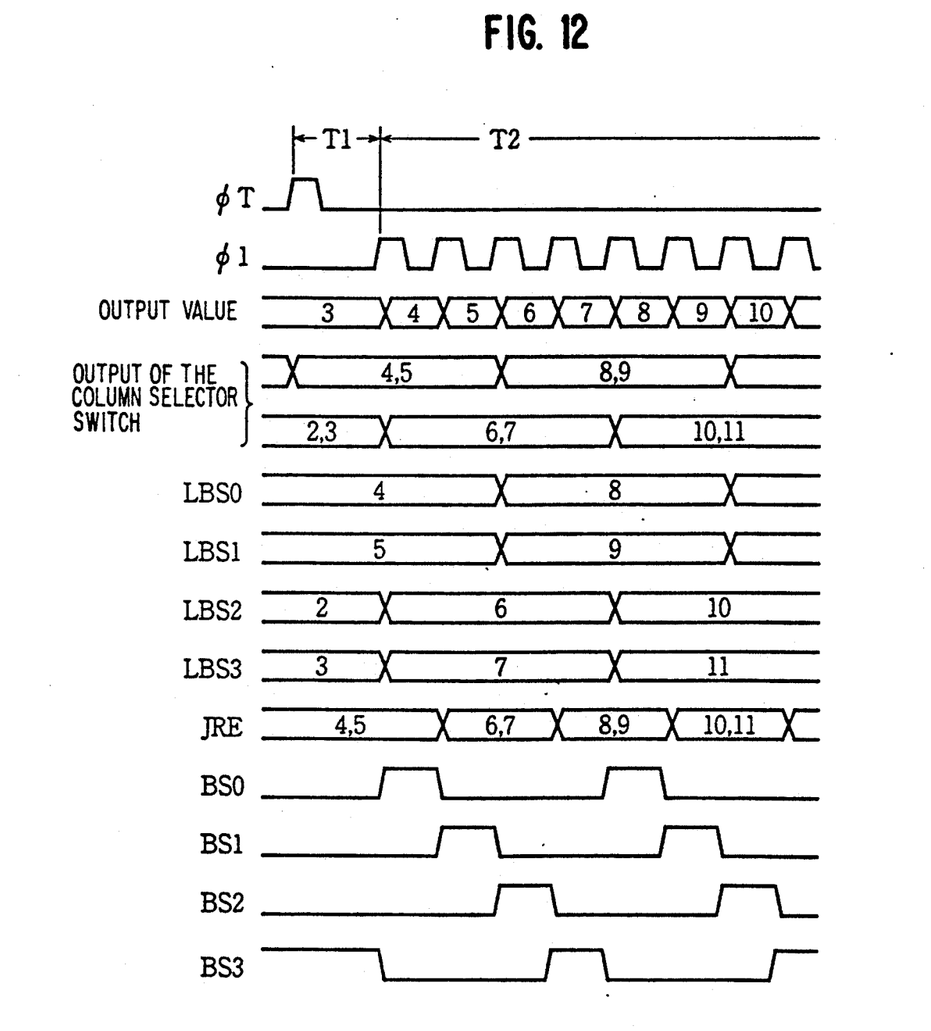
FIG. 12 shows a timing chart for explanation of a serial read in the first embodiment of the present invention.

Referring to FIG. 12 which shows a time chart for explanation of an operation of the first embodiment, in a time period T1, the transfer control signal ΦT is activated upon which the shift register 111 and the counter 312 are initialized by the address code word of the external column address signal AC. In this time period T1 (in FIG. 12, in the counter 312, a count value "3" corresponding to a 3rd address is set) a 4th address data of the data register 109 is read out on the read data bus LBS0. Similarly, the read data buses LBS1, LBS2 and LBS3 are initialized by 5th, 2nd and 3rd address data of the data register 109, respectively. Further, the signal BS3 among the bus select signals BS0 to BS3 of the bus select generator circuit 314 is activated and the remaining bus signals BS0, BS1 and BS2 are in inactive state. Since data necessary for determination of necessity of substitution by the redundancy circuit is an input signal to the counter 312, it is initialized to the external column address signal AC plus 1, that is, to a value "4".

In a time period T2 subsequent to T1, the first control signal Φ1 is activated. The shift register 111 is shifted up by the first control signal ΦT as the clock input and the column selector switch circuits 310-0 to 310-3 are switched off while the column selector switch circuits 310-4 to 310-7 are switched on.

Therefore, the 4th, 5th, 6th and 7th address data of the data register 109 are read out on the read data buses LBS0, LBS1, LBS2 and LBS, respectively. The bus select signal BS0 among the bus select signals BS0 to BS4 is activated and the data on the read data bus LBS0, that is, the 4th address data of the data register 109, is serially output and read out. On the other hand, although the counter input signal is changed from "4" to "5", the clock signal RCK from the bus select generator circuit 314 and supplied to the DFF 313 for redundancy substitution determination is not active and the second control signal Φ2 which is an output of the DFF 313 is not changed. Further, the column selector switch circuits 310-4 to 310-7 are switched on under control of the shift register 111 having the control signal Φ1 as its clock input, the 4th, 5th, 6th and 7th address data of the data register 109 are read out on the data buses LBS0, LBS1, LBS2 and LBS3, respectively, and the output values "4" and "5" of the counter 312 are not changed. However, the second control signal Φ2 which is an output of the DFF 313 is activated by the clock signal RCK and the determination of necessity of redundancy substitution is performed. That is, when the output value of the counter 312 is "5", redundancy determination is performed for the 6th and 7th address in order to perform the redundancy substitution of the column address signal AC corresponding to 2 columns. As described, the determination of redundancy substitution in the first embodiment completes before the serial read by the shift register 111 by one cycle.

Figure 4:
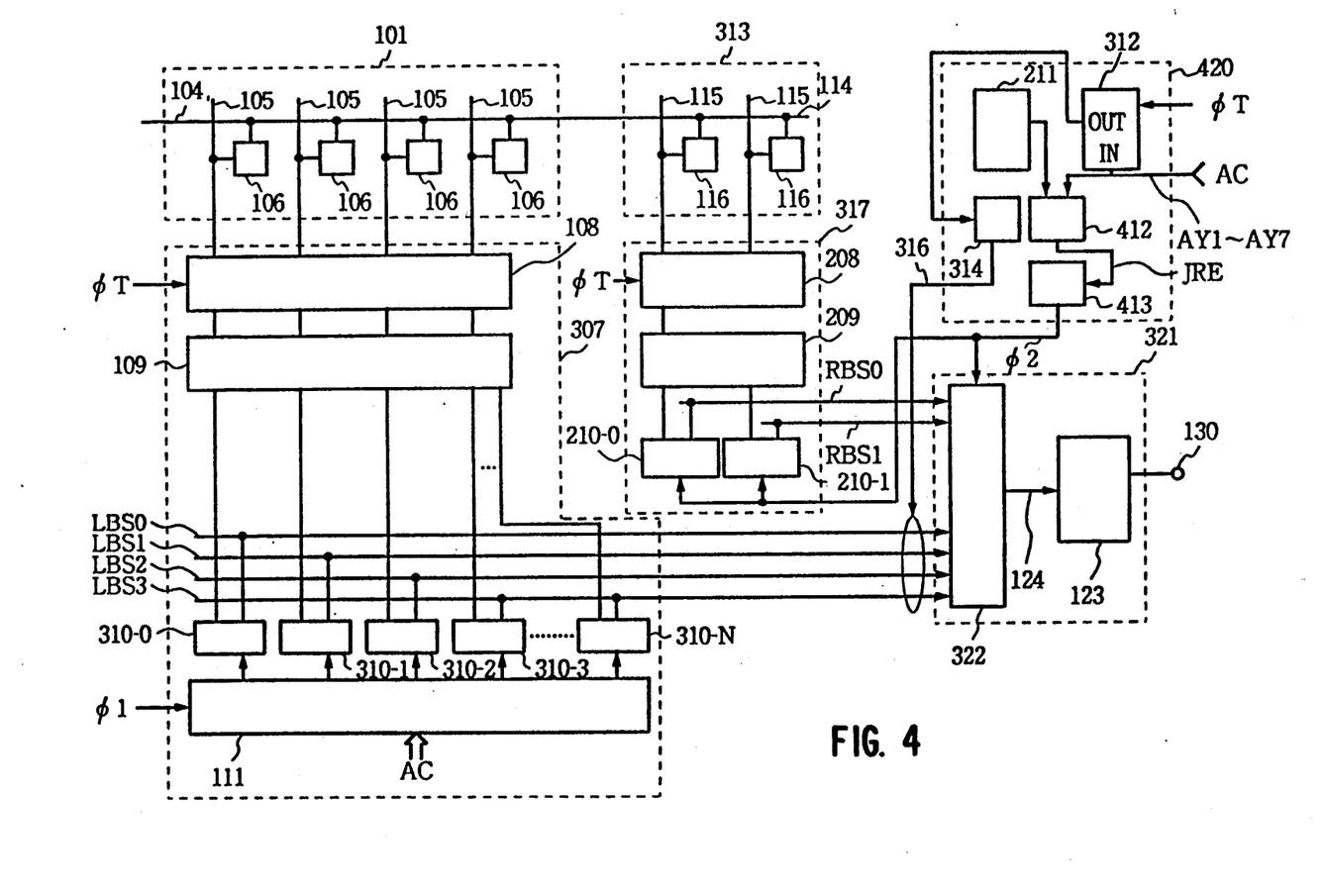
FIG. 4 is a block diagram showing a second embodiment of the present invention.

In a second embodiment of the present invention shown in FIG. 4, a redundancy control circuit 420 includes a coincidence detection circuit 412 having an input supplied with initial values AY1 to AY7 of an external address signal AC and comparing them with a content of a defective address memory circuit 211 and a DFF 413 for activating and outputting a second control signal when an output signal JRE of the coincidence detection circuit 412 indicates a coincidence of the both. Other portions of the second embodiment than these circuits are same as those of the first embodiment and thus depicted by same reference numerals, respectively.

Figure 13:
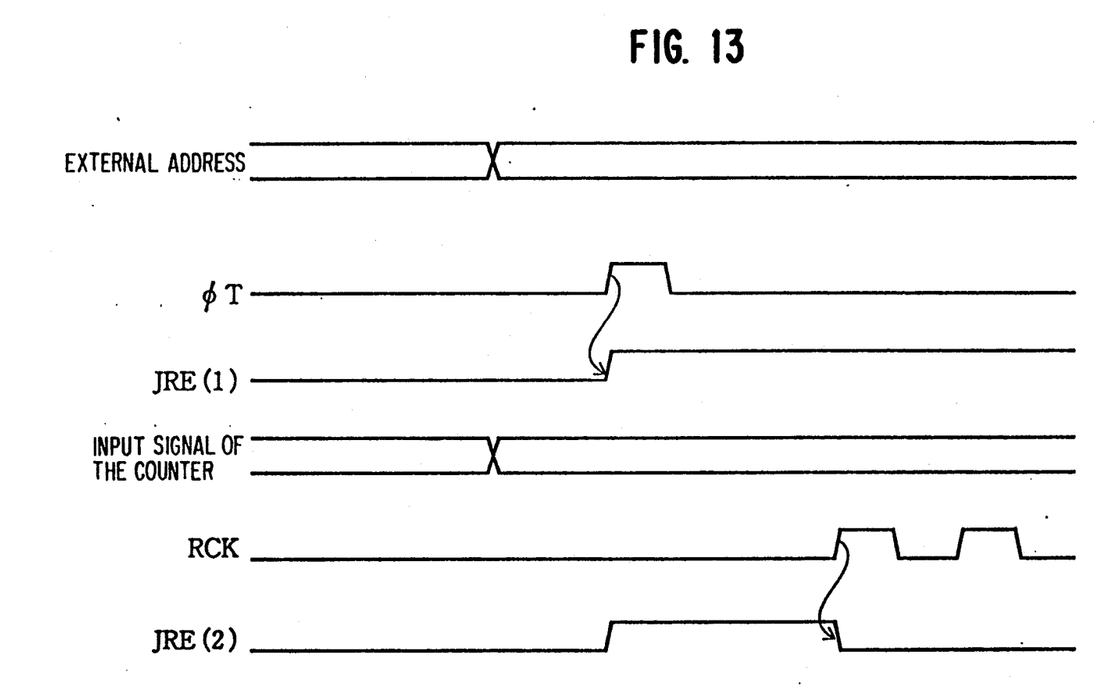
FIG. 13 shows a timing chart for explanation of a serial read in the second embodiment of the present invention.

Referring to FIG. 13 which shows a timing chart for explanation of operation of the second embodiment, when the determination of necessity of redundancy substitution by initializing the counter 312 with the initial value of the external column address signal AC as in the first embodiment, the determination address becomes the initial address of the address signal AC plus 1 since the determination address is the input signal of the counter 312. Therefore, it is impossible to perform the determination if the address value corresponds to the initial defect point. In the second embodiment, the initial address AY1 to AY7 are input to the input terminal of the coincidence detection circuit 412 in synchronism with the transfer control signal ΦT and compared with the defective address memory circuit 211. When the comparison result indicates a coincidence between them, the output JRE of the coincidence detection circuit 412 is activated and input to the set terminal of the DFF 413 which outputs the second control signal Φ2 activated. On the other hand, when the comparison result indicates an inconsistency, the output JRE is not activated, the DFF 413 is reset and the second control signal Φ2 is kept inactive. As described, the redundancy substitution can be determined even for the initial address AY1 to AY7 of the external column address signal AC by means of the redundancy control circuit 420 of the second embodiment.

Figure 5:
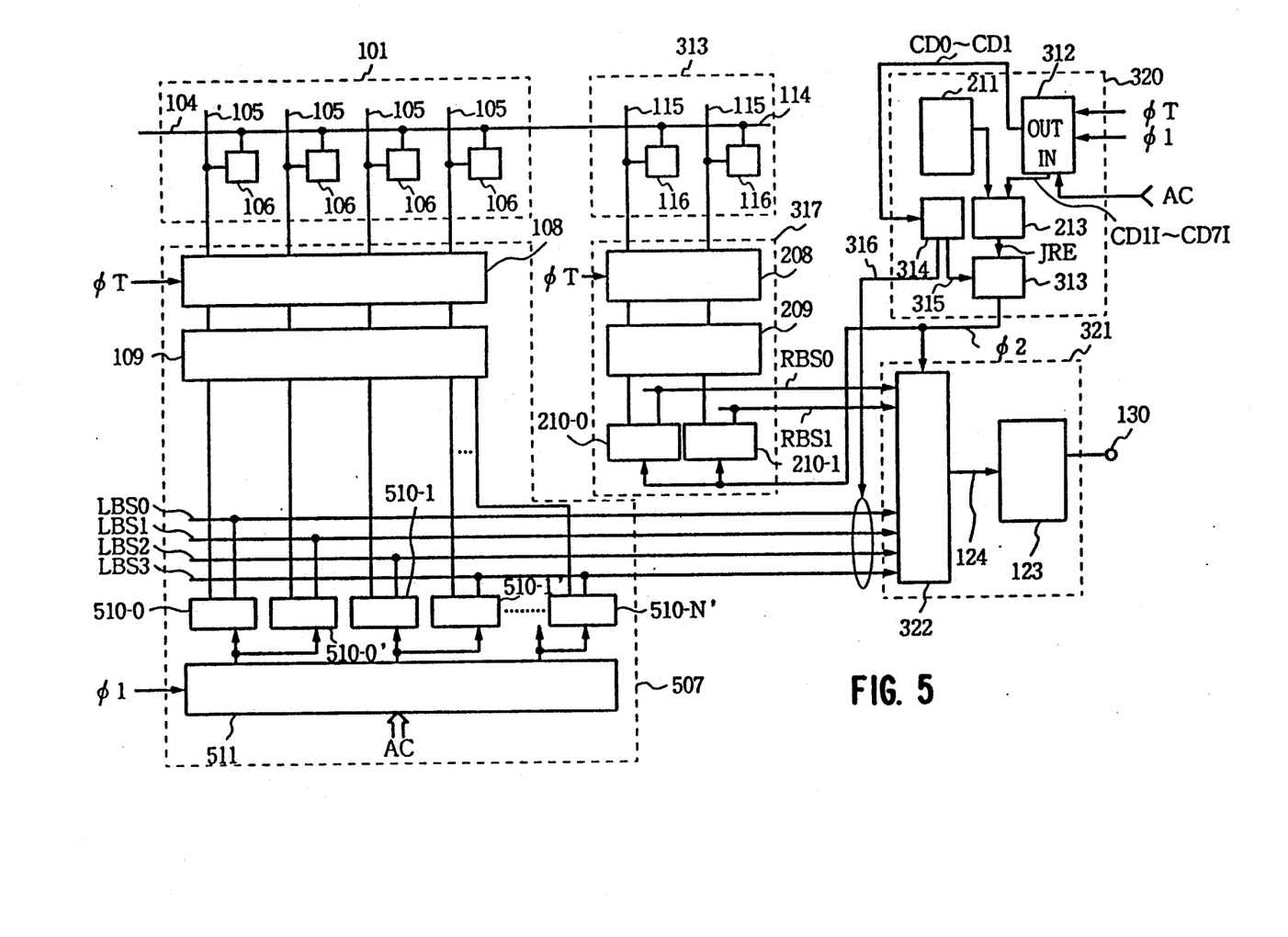
FIG. 5 is a block diagram showing a third embodiment of the present invention.

Referring to FIG. 5, the third embodiment shown in this figure includes an interleave type serial selector circuit 507 which is constituted with column selector switch circuit pairs 510-0/510-0', 510-1/510-1', ..., 510-3/510-3' instead of the column selector circuits 310-0 to 310-3 of the second embodiment. Other portion of the third embodiment than this circuit are same as those of the second embodiment and depicted by same reference numerals, respectively. The interleave type serial selector circuit is conventional in which even numbered output and odd numbered output of a shift register are treated in an interleave manner by using the existing technique.

As described, in the present invention which includes means for performing a determination of redundancy substitution at an input of a counter when a serial read is performed in response to the first control signal and outputting and holding the second control signal as a result of determination, the determination of redundancy substitution can be performed in a read cycle in advance to a conventional serial read cycle by one cycle. Further, the dual-port RAM according to the present invention which includes a plurality of read data buses, the serial port read speed in the interleave system may be improved. Since, therefore, the time from the determination of necessity of redundancy substitution to an execution of the substitution is shortened. Further, since, therefore, it is possible to advance the read out operation by one cycle compared with the conventional technique, a speed-up of serial read out can be achieved.

Although the present invention has been described with reference to specific embodiments, this description is not meant to be construed in a limiting sense. Various modifications of the disclosed embodiment, as well as other embodiments of the present invention, will become apparent to persons skilled in the art upon reference to the description of the present invention. It is therefore contemplated that appended claims will cover any modifications or embodiments as fall within the true scope of the present invention.

What is claimed is:

1. A dual-port semiconductor memory comprising:
   a memory cell array including a plurality of memory cells arranged in row and column directions, a plurality of bit lines each connecting these memory cells in a row commonly and a plurality of word lines each connecting the memory cells in a column commonly;
   a row address decoder responsive to a row address signal to select one of the bit lines;
   a column address decoder responsive to a column address signal to select one of the word lines;
   at least two redundancy memory cells;
   a serial selector circuit for selecting the memory cells serially in synchronism with a first control signal;
   a defective address memory circuit for storing a location of a defective memory cell among the memory cells;
   a counter having an output corresponding to a memory cell address selected by said serial selector circuit and adapted to be incremented in response to the first control signal;
   a coincidence detection circuit for comparing an input signal of said counter with an output of said defective address memory circuit and outputting a second control signal for substituting said two redundancy memory cells for said memory cells corresponding to at least two of said bit lines when said input signal of the counter coincides with said output of the defective address memory circuit;
   means for receiving an initial address corresponding to an external address signal code word;
   wherein said serial selector circuit comprises a data register having a plurality of memory stages, a data transfer circuit for connecting the memory cells to the data register, a plurality of read data buses, a column selector circuit for connecting the data register to the read data buses, and a shift register having a plurality of outputs for control of said column selector circuit and incremented with the initial address;
   a D-F/F circuit for holding said output of said coincidence detection circuit; and
   a read data bus selector circuit responsive to said counter for selecting one of said plurality of read data buses, wherein an output of said read data bus selector circuit is a clock signal of said D-F/F circuit.

2. A dual-port semiconductor memory comprising:
   a memory cell array including a plurality of memory cells arranged in row and column directions, a plurality of bit lines each connecting the memory cells in a row commonly and a plurality of word lines each connecting the memory cells in a column commonly;
   a column address decoder responsive to a column address signal to select one of the bit lines;
   a row address decoder responsive to a row address signal to select one of the word lines;
   at least one redundancy memory cell;
   a serial selector circuit for selecting the memory cells serially in synchronism with a first control signal;
   a defective address memory circuit for storing a location of a defective memory cell among the memory cells on a memory chip;
   means for receiving an initial address corresponding to an external address signal code word;
   a coincidence detection circuit for incrementing the initial address corresponding to an address signal code word of said address signal in synchronism with a transfer signal, comparing the incremented address with an output of the defective address memory circuit and outputting a second control signal for substituting the redundancy memory cell for the memory cell corresponding to said one bit line when the incremented address coincides with the output of the defective address memory circuit;
   a D-F/F circuit for holding the output of said coincidence detection circuit;
   wherein said serial selector circuit comprises a data register having a plurality of memory stages, a data transfer circuit for connecting said memory cells to said data register, a plurality of read data buses, a column selector circuit for connecting said data register to said read buses, and a shift register having a plurality of outputs for control of said column selector circuit and adapted to be incremented with said initial address; and
   a read data bus selector circuit responsive to said incremented initial address for selecting one of said plurality of read data buses, and wherein an output of said read data bus selector circuit is a clock signal of said D-F/F circuit.

* * * * *

UNITED STATES PATENT AND TRADEMARK OFFICE
CERTIFICATE OF CORRECTION

PATENT NO. : 5,325,332
DATED : June 28, 1994
INVENTOR(S) : Mitsue TAGAYA

It is certified that error appears in the above-indentified patent and that said Letters Patent is hereby corrected as shown below:

On the title page item [73], delete "Nec", and insert --NEC--;
On the title page item [30], Foreign Application Priority Data, delete "4-256113", and insert --3-256113--.

Signed and Sealed this

Fourth Day of April, 1995

BRUCE LEHMAN

*Attest:*

*Attesting Officer*   Commissioner of Patents and Trademarks